(12) United States Patent
Sargent et al.

(10) Patent No.: US 9,210,773 B1
(45) Date of Patent: Dec. 8, 2015

(54) WIRELESS LIGHT FIXTURE

(71) Applicants: Donald A. Sargent, Wickliffe, OH (US); Timothy Chen, Aurora, OH (US)

(72) Inventors: Donald A. Sargent, Wickliffe, OH (US); Timothy Chen, Aurora, OH (US)

(73) Assignee: TECHNICAL CONSUMER PRODUCTS, INC., Aurora, OH (US)

( * ) Notice: Subject to any disclaimer, the term of this patent is extended or adjusted under 35 U.S.C. 154(b) by 0 days.

(21) Appl. No.: 14/290,359

(22) Filed: May 29, 2014

(51) Int. Cl.
| | | |
|---|---|---|
| *H05B 37/02* | (2006.01) | |
| *F21V 21/30* | (2006.01) | |
| *H05B 33/08* | (2006.01) | |
| *F21V 15/01* | (2006.01) | |
| *F21V 19/04* | (2006.01) | |

(52) U.S. Cl.
CPC .............. *H05B 37/02* (2013.01); *F21V 15/011* (2013.01); *F21V 19/045* (2013.01); *F21V 21/30* (2013.01); *H05B 33/086* (2013.01); *H05B 33/0845* (2013.01); *H05B 37/0227* (2013.01)

(58) Field of Classification Search
CPC . F21V 21/30; F21V 23/0442; F21V 23/0464; F21V 15/01; F21V 15/013; F21V 29/004; F21V 29/76; F21V 29/71; F21V 15/015; H05B 37/0227; H05B 37/02; G08C 19/00; H01R 24/38; H01R 33/945; G01J 1/0271; G01J 1/0403; G01J 1/0407; F21W 2131/10; F21W 2131/305; F21S 4/008; F21Y 2101/02; F21Y 2103/003; F25D 27/00
See application file for complete search history.

(56) References Cited

U.S. PATENT DOCUMENTS

| | | | |
|---|---|---|---|
| 6,259,476 B1 | 7/2001 | Greene | |
| 8,038,481 B1 * | 10/2011 | Creighton et al. | ............ 439/660 |
| 8,235,555 B2 | 8/2012 | Thomas et al. | |
| 8,398,435 B2 * | 3/2013 | Aurongzeb et al. | ..... 439/607.41 |
| 2012/0025711 A1 | 2/2012 | Best et al. | |
| 2012/0274208 A1 | 11/2012 | Chen et al. | |
| 2013/0044444 A1 * | 2/2013 | Creighton et al. | ............ 361/752 |
| 2014/0021862 A1 | 1/2014 | Chung | |
| 2015/0048759 A1 * | 2/2015 | Jo | ................................ 315/297 |
| 2015/0092408 A1 * | 4/2015 | Wallach | ........................ 362/233 |

OTHER PUBLICATIONS

PCT, International Search Report and Written Opinion, International Application No. PCT/US2015/030719 (mailed Aug. 28, 2015).

* cited by examiner

*Primary Examiner* — Vibol Tan
(74) *Attorney, Agent, or Firm* — Thompson Hine LLP

(57) ABSTRACT

A light fixture may have a housing containing a lighting element and any number of PCBs. A first PCB section may have circuitry that controls the lighting element. A second PCB section may have an antenna and circuitry that converts RF signals into control signal input to the first PCB section. The second PCB section may be operatively interconnected with the first PCB section, and may be contained in the housing in an orientation projecting from the first PCB section.

15 Claims, 5 Drawing Sheets

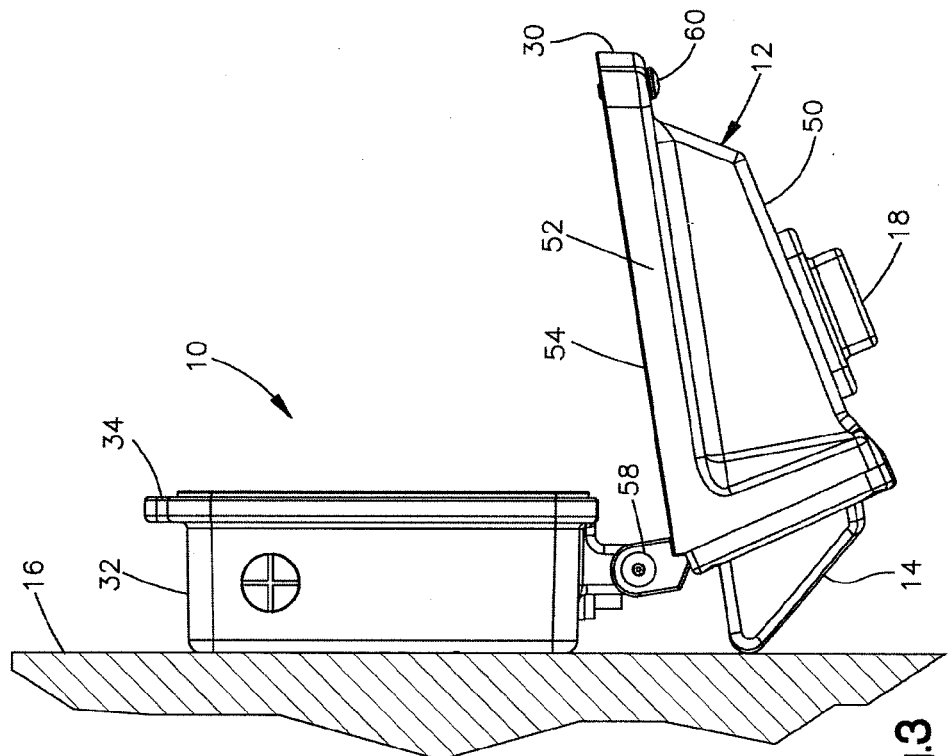
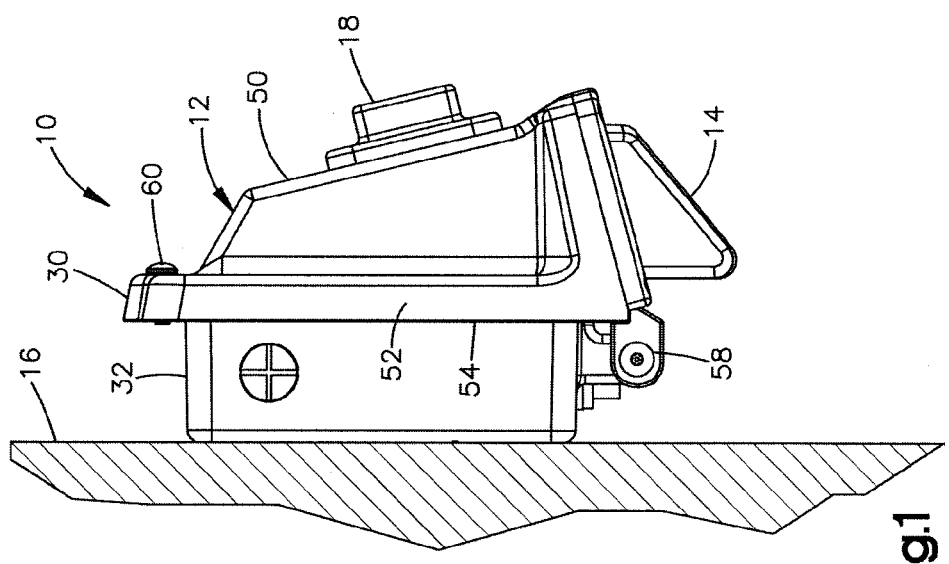

WIRELESS LIGHT FIXTURE

TECHNICAL FIELD

This technology relates to the field of light fixtures, and specifically relates to a light fixture with wireless control.

BACKGROUND

A light fixture may include a housing that is mounted on a wall or other structure beside an area to be lighted. The housing may contain a lighting element, and may also contain a printed circuit board (PCB) with power control architecture for controlling the lighting element. In a light fixture having wireless control, the PCB may further include an antenna and other components that receive radio frequency (RF) signals and convert them into control signals that are compatible with the control architecture. These two functional areas of the PCB can be mounted on a single PCB or on multiple PCBs. However, the housing and the internal structure that supports the PCB inside the housing may obstruct the access needed for RF signals to reach the antenna most effectively.

SUMMARY

An embodiment may include a housing containing a lighting element and a single PCB or multiple PCBs that contain all or part of the components and circuitry for the power section and the RF section that are required to power and control the light source. For example, a first PCB section may have circuitry that controls the lighting element. A second PCB section may have an antenna and circuitry that converts RF signals into control signal input to the first PCB section. The second PCB section may be operatively interconnected with the first PCB section, and may be contained in the housing in an orientation projecting from the first PCB section.

An embodiment may also include a housing having a first portion and a second portion projecting outward from the first portion. A lighting element may be contained in the housing. A first PCB may be contained in the first portion of the housing, and may have circuitry that controls the lighting element. A second PCB may have an antenna and circuitry that converts RF signals into control signal input to the first PCB. The second PCB may be operatively interconnected with the first PCB, and may be contained in the housing in an orientation projecting from first portion of the housing into the second portion of the housing.

Summarized differently, an embodiment may include a housing containing a lighting element. The housing may have an outer wall with an aperture, and may contain a driver box. The housing may also contain a driver box cover that closes the driver box. The driver box cover may have an aperture. A first PCB section may be contained in the driver box, and may have circuitry that controls the lighting element. A second PCB section may have an antenna and circuitry that converts RF signals into control signal input to the first PCB section, and may be operatively interconnected with the first PCB section inside the driver box. The second PCB section may project outward from the driver box at various orientations relative to the first PCB section in order to optimize the reception of the RF signal. The second PCB section may project outward through the aperture in the driver box cover, and may project further outward through the aperture in the outer wall of the housing, with the antenna located at least partially outside the outer wall of the housing.

BRIEF DESCRIPTION OF THE DRAWINGS

FIG. 1 is a side view of a light fixture mounted on a wall.
FIG. 3 is a side view showing the fixture of FIG. 1 in an open condition.

DETAILED DESCRIPTION

Figure 2:
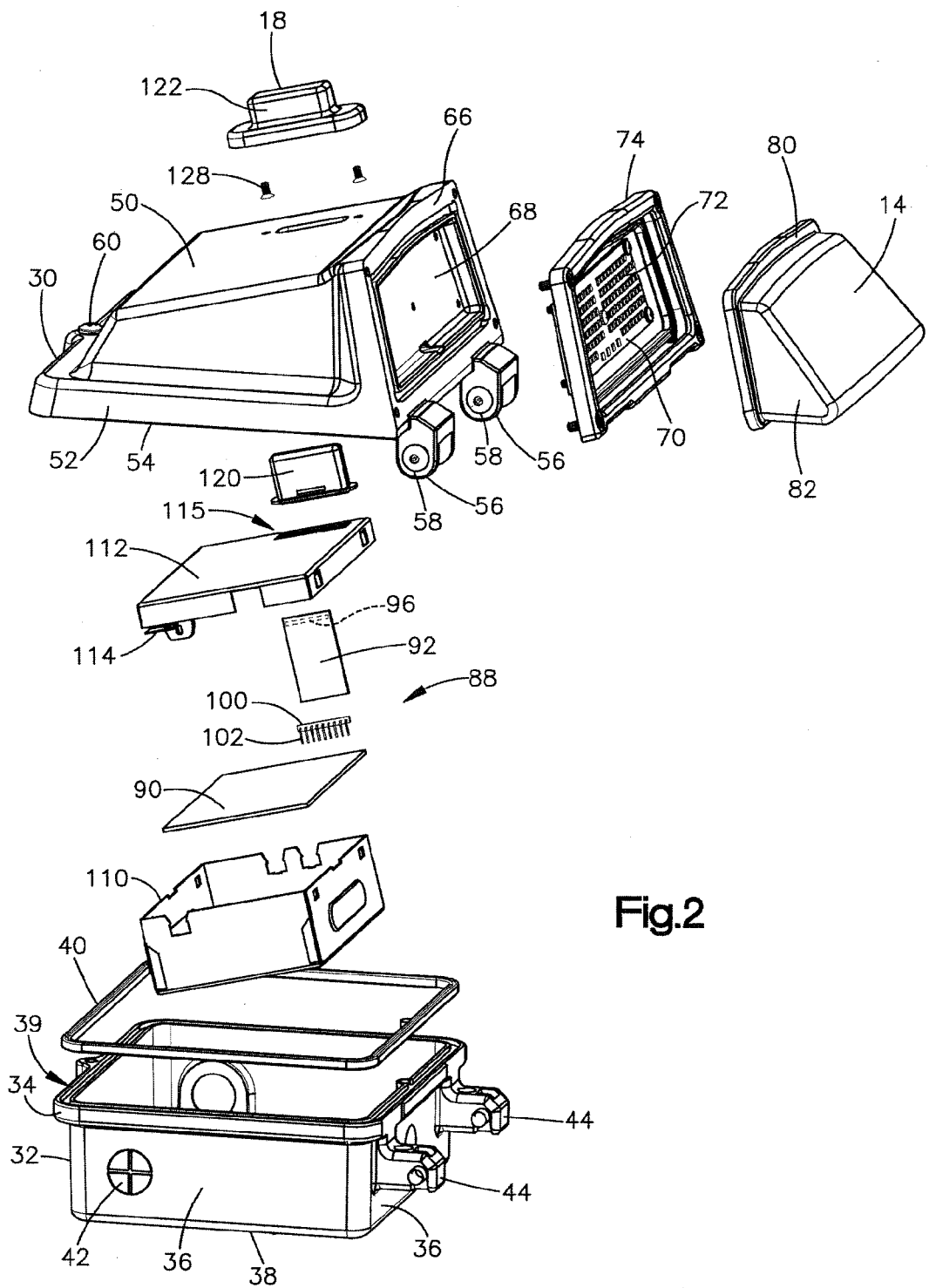
FIG. 2 is an exploded view showing parts of the fixture of FIG. 1.

The following detailed description illustrates the general principles of the invention, examples of which are illustrated in the accompanying drawings.

As shown in FIG. 1, an embodiment of a light fixture 10 may include a housing 12 and a lens 14. The housing 12 may be mounted on a wall 16 in a position from which the lens 14 can direct light outward from a lighting element contained within the housing 12. A portion 18 of the housing 12 may cover an antenna for wireless operation of the lighting element.

The housing 12 in the illustrated embodiment includes a cover 30 and a base 32. The base 32 is preferably configured to contain a motion sensor and/or a light sensor for automatic operation of the fixture 10. As shown separately in the exploded view of FIG. 2, the base 32 may be shaped as a generally rectangular box with an open upper end 34, side walls 36, and a bottom wall 38. The upper end 34 may have a peripheral groove 39 for receiving a gasket 40. Knockouts 42 may be provided in the side walls 36, and a pair of mounting bosses 44 may project from one of the side walls 36. The bottom wall 38 may have one or more apertures for fasteners to attach the base 32 to the wall 16 or other structure upon which the housing 12 can be mounted as shown for example in FIG. 1. The bottom wall 38 may also have one or more apertures for receiving power lines from an electrical box in the wall 16 or other mounting structure.

The cover 30 may have an outer wall 50, and may have an open inner side 52 opposite the outer wall 50. The open inner side 52 may have a peripheral size and shape matching that of the base 32 at the open upper end 34, with edges 54 corresponding to the side walls 36 of the base 32. The cover 30 may also have mounting bosses 56 corresponding to the mounting bosses 44 on the base 32. The mounting bosses 56 and 44 may together receive hinge pins 58 to support the cover 30 on the base 32 for pivotal movement between a closed position, as shown in FIG. 1, and a fully open position, as shown in FIG. 3. A releasable fastener 60 may secure the cover 30 in the closed position.

The cover 30 may also have a generally rectangular peripheral surface 66 surrounding a panel support surface 68 adjacent to the mounting bosses 56. A lighting element, which in the given example is a lighting panel 70 with an array of LEDs 72, may be installed over the panel support surface 68. A trim ring 74 may be installed over the peripheral surface 66, and may reach slightly inward over the lighting panel 70 to retain it in place on the panel support surface 68. A flange portion 80 of the lens 14 may be captured between the trim ring 74 and the peripheral surface 66 of the cover 30, with a body portion 82 of the lens 14 projecting outward through the trim ring 74. In the illustrated embodiment, this particular example of a lens 14 is configured to disperse light from the LEDs 72 over a wide area. Further regarding the illustrated embodiment, the given example of a lighting element is a lighting panel 70 with an array of LEDs 72, but other suitable lighting elements include any devices that generate visible light such as, for example, incandescent, halogen, and CFL lamps.

Other parts of the fixture 10 that are shown in FIG. 2 include a PCB assembly 88 with multiple PCB sections that are located on one PCB or multiple PCBs. In the illustrated example, the PCB assembly 88 includes first and second PCBs 90 and 92. The first PCB 90, which may be referred to as a driver power board 90, has power control circuitry configured to control the lighting functions of the LEDs 72. Such functions include ON/OFF, color, lumen intensity, etc., and the driver power board 90 may be configured accordingly in any suitable manner known in the art. The second PCB 92 also may be configured in any suitable manner known in the art, but unlike the driver power board 90, the second PCB 92 includes an antenna 96 and circuitry configured to convert radio frequency signals into power signal input to the driver power board 90. The second PCB 92 may thus be referred to as an RF control board 92.

In the assembled fixture 10, the RF control board 92 is electrically coupled with the driver power board 90 for the antenna 96 and signal converting circuitry to be operatively interconnected with the power control circuitry. With the antenna 96 and associated circuitry located on a separate RF control board 92 instead of on the driver power board 90, the antenna 96 can be located and oriented differently from the location and orientation of the driver power board 94. This enables the antenna 96 be installed in the fixture 10 in a position and orientation best suited to receive RF signals from outside the housing 12 without constraints that might otherwise be imposed by the position or orientation of the driver power board 90.

Figure 4:
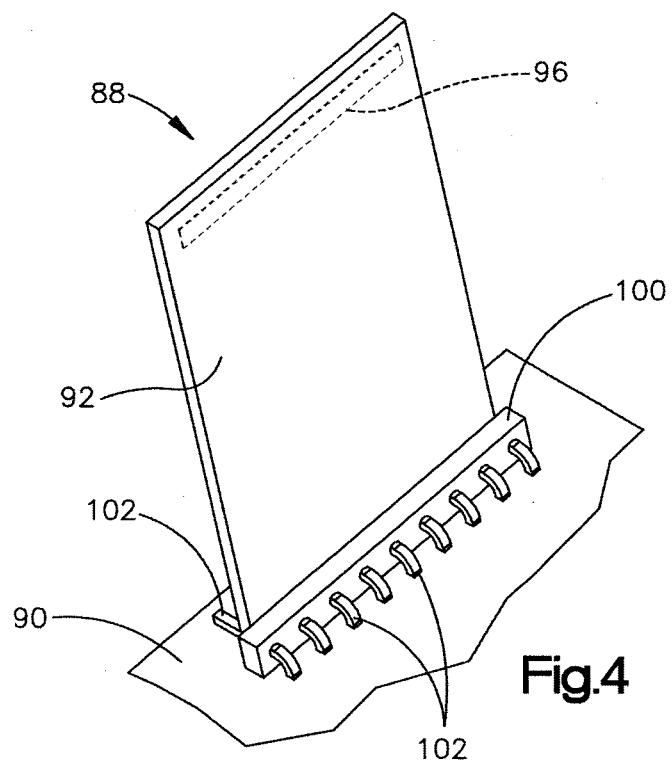
FIG. 4 is an enlarged partial view of parts shown in FIG. 2.

The various sections of the PCB assembly 88 may be operatively interconnected using connectors, fasteners, cables, or other known methods. In the illustrated embodiment, this particular example of an RF control board 92 is arranged relative to the associated driver power board 90 as shown in greater detail in FIG. 4. Specifically, a right angle header block 100 reaches partially across the driver power board 90. Connector pins 102 reaching through the header block 100 are soldered to the two boards 90 and 92 to establish both an electrical coupling and a structural support coupling between the two boards 90 and 92. Accordingly, the RF control board 92 in the given example projects orthogonally from one side of the driver power board 90. Other orientations may be employed as needed for particular implementations of a PCB assembly.

Figure 5:
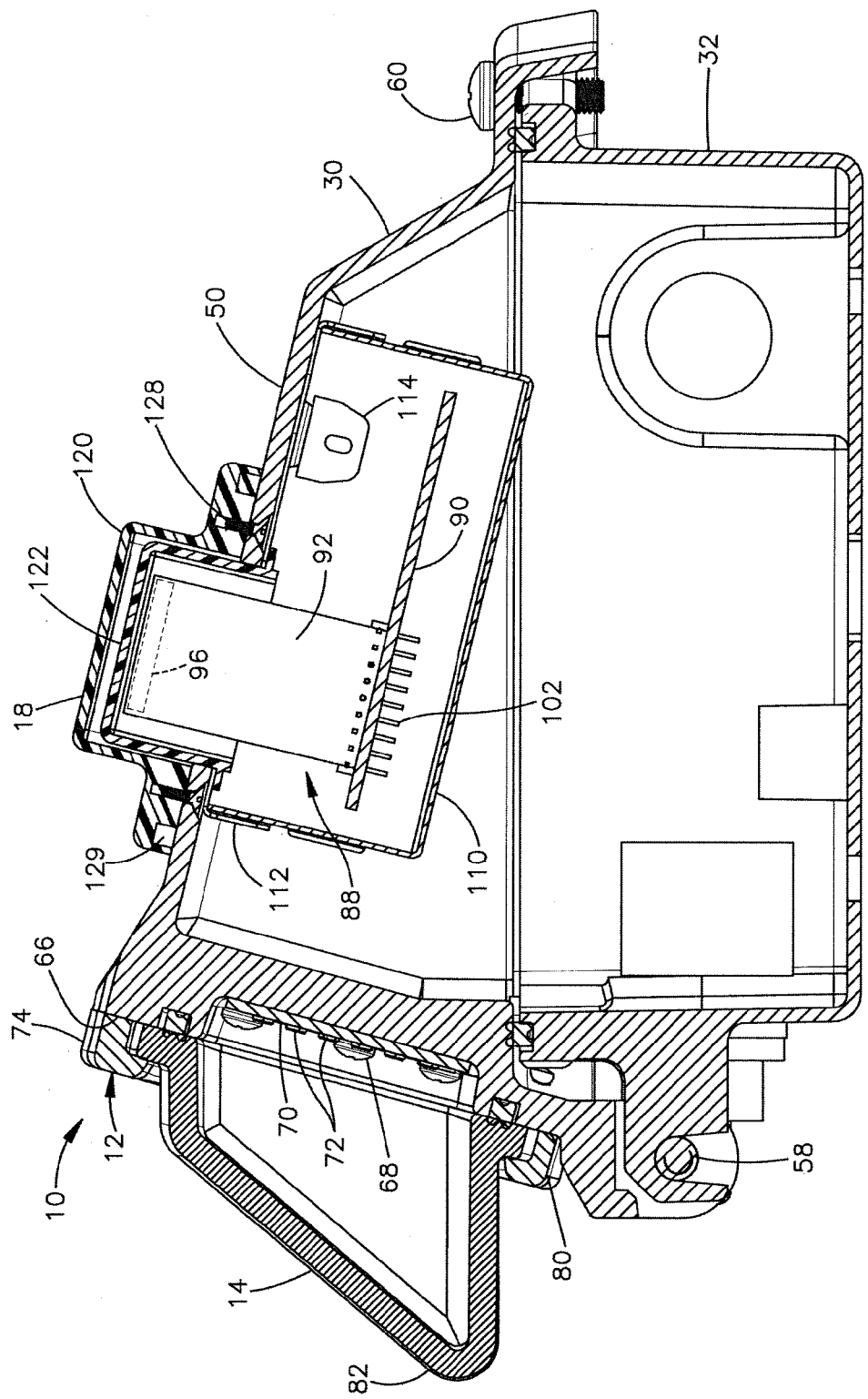
FIG. 5 is a section side view of the fixture of FIG. 1.

With further reference to FIG. 2, additional parts may include a driver box 110 and a driver cover 112. The driver cover 112 may be received over the driver box 110 as shown in FIG. 5. Those parts 110 and 112 may have tabs 114 for fastening to the cover 30 at the inside of the outer wall 50.

The driver power board 90 may be installed within the driver box 110, and may be supported in the driver box 110 by potting compound, mounting tabs, or the like (not shown). In this arrangement the RF control board 92 projects from the driver power board 90 toward the driver cover 112 at the outer wall 50. A slot 115 (FIG. 2) in the driver cover 112 may be aligned with a slot 117 in the outer wall 50 to provide clearance for the RF control board 92 to project outward through the slots 115 and 117 and emerge from the cover 30 at that location. The RF control board 92 preferably projects outward sufficiently for at least part of the antenna 96, and most preferably the entire antenna 96, to be located outward of the cover 30. This helps to ensure that the antenna 96 will receive RF signals with little or no interference from the other parts of the fixture 10.

Figure 6:
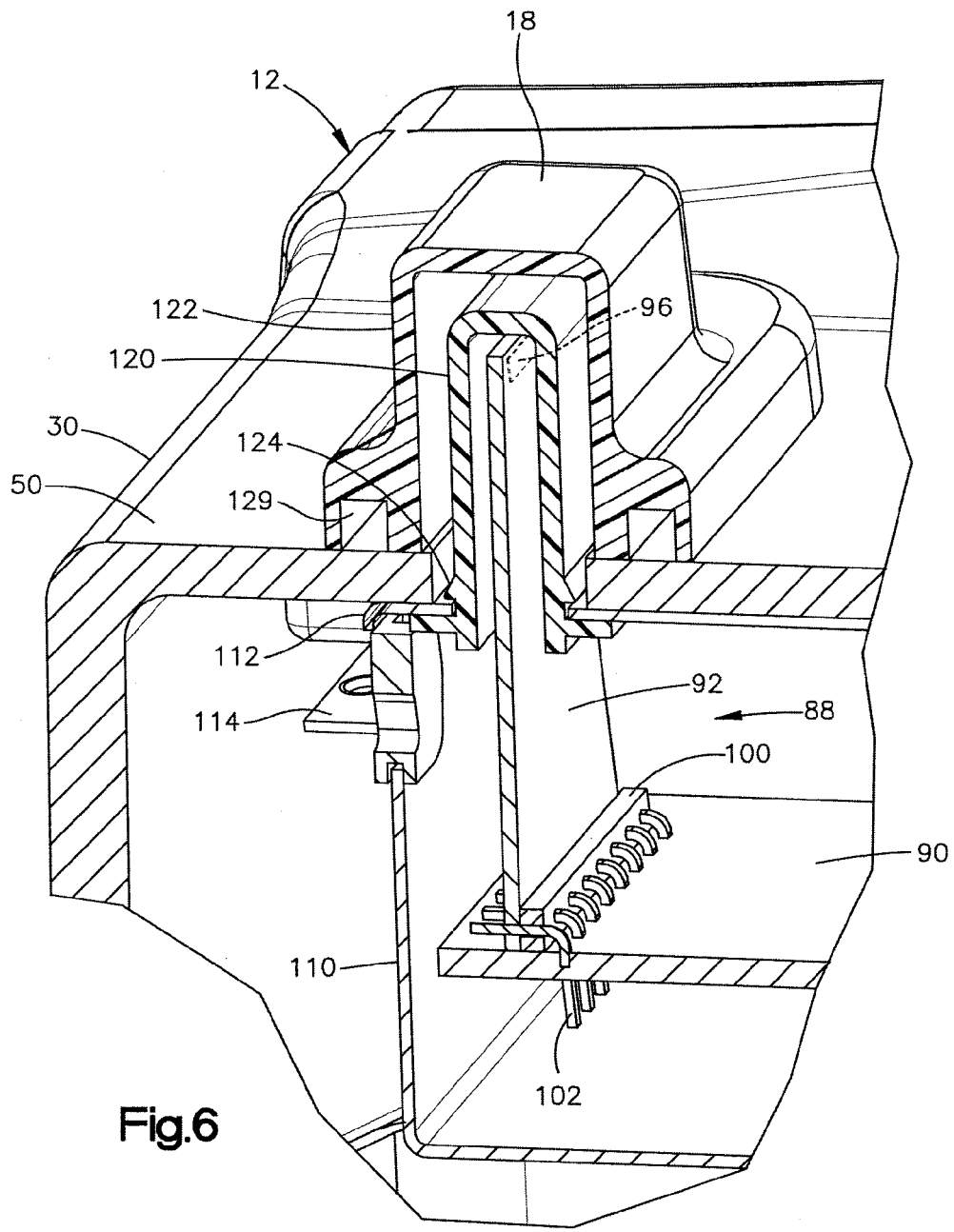
FIG. 6 is an enlarged partial view of parts shown in FIG. 5.

The portion 18 of the housing 12 that serves as an antenna cover, as noted above with reference to FIG. 1, is installed over the outwardly projecting portion of the RF control board 90. As shown in FIGS. 5 and 6, the antenna cover 18 in the given example may include two cover parts 120 and 122. The first cover part 120 may be received upwardly through the slots 115 and 117, and may have locking tabs 124 that snap into interlocked engagement with the driver cover 112. The second cover part 122 may fit over the first cover part 120 at the outer wall 50, and may be secured to the outer wall 50 by fasteners 128. A groove 129 at the bottom of the second cover part 122 may receive an O-ring to provide a seal.

Further regarding the cover 30 and the base 32 of the housing 12, those parts may be formed of any suitable material known in the art, such as aluminum, without the need for transmittance of RF signals. The antenna cover 18, in which the RF control board 92 projects outward from the other parts of the housing 12, is preferably formed of a nonmetallic material that allows RF signals to pass through such as, but not limited to, plastic.

Figure 7:
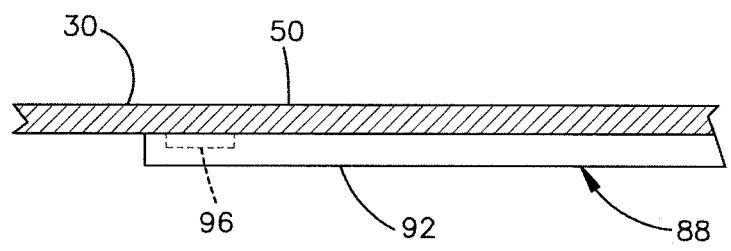
FIG. 7 is as partial view of another embodiment of a light fixture.

As noted above, other orientations of the antenna may be employed for optimal RF reception. For example, in the embodiment shown partially in FIG. 7, the section of the PCB assembly 88 that includes the antenna 96 lays flat against the outer wall 50 of the cover 30.

While the forms of apparatus herein described constitute preferred embodiments of the invention, the invention is not limited to these precise forms, and changes may be made without departing form the scope of the invention.

What is claimed is:

1. An apparatus comprising:
   a housing having an outer wall with an aperture;
   a lighting element;
   a first PCB section contained in the housing and having circuitry configured to control the lighting element; and
   a second PCB section having an antenna and circuitry configured to convert RF signals into control signal input to the first PCB section, the second PCB section being operatively interconnected with the first PCB section;
   wherein the second PCB section is installed in an orientation projecting outward through the aperture in the outer wall of the housing, with the antenna located at least partially outside the outer wall of the housing.

2. An apparatus comprising:
   a housing having an outer wall with an aperture;
   a lighting element;
   a driver box contained in the housing;
   a driver box cover closing the driver box and having an aperture;
   a first PCB section contained in the driver box and having circuitry configured to control the lighting element; and
   a second PCB section having an antenna and circuitry configured to convert RF signals into control signal input to the first PCB section, the second PCB section being operatively interconnected with the first PCB section inside the driver box;
   wherein the second PCB section projects outward from the driver box through the aperture in the driver box cover, and projects further outward through the aperture in the outer wall of the housing, with the antenna located at least partially outside the outer wall of the housing.

3. An apparatus as defined in claim 2 wherein the housing includes a nonmetallic antenna cover received over the second PCB section and covering the second PCB section outside the outer wall of the housing.

4. An apparatus as defined in claim 3 wherein the antenna cover has a part projecting outward through the aperture in the driver box cover.

5. An apparatus as defined in claim 4 wherein the part of the antenna cover that projects outward through the aperture in the driver box cover is interlocked with the driver box cover.

6. An apparatus as defined in claim 4 wherein the antenna cover has a separate part received over the part that projects outward through the aperture in the driver box cover.

7. An apparatus as defined in claim 6 wherein the separate part of the antenna cover is fastened to the outer wall of the housing over the aperture in the outer wall.

8. An apparatus as defined in 2 wherein the antenna is located entirely outside the outer wall of the housing.

9. An apparatus as defined in claim 2 wherein the first PCB section is part of a first PCB and the second PCB section is part of a second PCB coupled with the first PCB.

10. An apparatus as defined in 1 wherein the antenna is located entirely outside the outer wall of the housing.

11. An apparatus as defined in claim 1 wherein the outer wall of the housing is foamed of material that includes metallic material.

12. An apparatus as defined in claim 11 wherein the housing includes a nonmetallic antenna cover received over the second PCB section and covering the second PCB section outside the outer wall of the housing.

13. An apparatus as defined in claim 12 wherein the antenna cover has a part projecting outward through the aperture in the outer wall of the housing.

14. An apparatus as defined in claim 13 wherein the antenna cover has a separate part received over the part that projects outward through the aperture in the outer wall of the housing.

15. An apparatus as defined in claim 14 wherein the separate part of the antenna cover is fastened to the outer wall of the housing over the aperture in the outer wall.

* * * * *